US012604394B2

(12) United States Patent  
Tsai et al.

(10) Patent No.:   US 12,604,394 B2  
(45) Date of Patent:       Apr. 14, 2026

(54) OPTICAL TRANSCEIVER EQUIPPED WITH GROUND VIA

(71) Applicant: Prime World International Holdings Ltd., New Taipei City (TW)

(72) Inventors: Chao-Hung Tsai, New Taipei City (TW); Che-Shou Yeh, New Taipei City (TW); Ming-Chuan Wang, New Taipei City (TW)

(73) Assignee: Prime World International Holdings Ltd., New Taipei City (TW)

( * ) Notice: Subject to any disclaimer, the term of this patent is extended or adjusted under 35 U.S.C. 154(b) by 195 days.

(21) Appl. No.: 18/398,579

(22) Filed: Dec. 28, 2023

(65) Prior Publication Data

US 2025/0220804 A1      Jul. 3, 2025

(51) Int. Cl.
| | |
|---|---|
| *H05K 1/02* | (2006.01) |
| *H05K 1/11* | (2006.01) |
| *H05K 1/18* | (2026.01) |

(52) U.S. Cl.
CPC ......... *H05K 1/0228* (2013.01); *H05K 1/0219* (2013.01); *H05K 1/117* (2013.01); *H05K 1/18* (2013.01); *H05K 2201/09027* (2013.01); *H05K 2201/09609* (2013.01); *H05K 2201/10015* (2013.01); *H05K 2201/10522* (2013.01)

(58) Field of Classification Search
None
See application file for complete search history.

(56) References Cited

U.S. PATENT DOCUMENTS 12,029,631 B1 *  7/2024  Ward ................... H05K 1/0228

FOREIGN PATENT DOCUMENTS

CN        217587682 U  * 10/2022

OTHER PUBLICATIONS

CN 217587682 U Translation (Year: 2025).*

* cited by examiner

*Primary Examiner* — Timothy J Thompson
*Assistant Examiner* — John B Freal
(74) *Attorney, Agent, or Firm* — Grossman Tucker Perreault & Pfleger, PLLC

(57)             ABSTRACT

An optical transceiver includes a substrate, filtering capacitors, radio-frequency (RF) signal lines and ground vias. The substrate has two side edges and a distal edge, and has a main region and a golden finger region. The filtering capacitors are disposed in the main region on the substrate. The RF signal lines are connected to the filtering capacitors and each includes a first conductive portion disposed in the substrate and extending from the main region to the golden finger region, a second conductive portion disposed on the substrate and located in the golden finger region and a conductive via connecting the first conductive portion and the second conductive portion and extending no more than three layers of the substrate. The ground vias locate at the two side edges and the distal edge. A shortest distance between each RF signal line and the two side edges is larger than 0.95 mm.

16 Claims, 11 Drawing Sheets

OPTICAL TRANSCEIVER EQUIPPED WITH GROUND VIA

BACKGROUND

1. Technical Field

This disclosure relates to an optical transceiver, more particularly to an optical transceiver equipped with ground vias.

2. Related Art

Fiber optics are widely used for transmitting audio and data signals. As a transmission medium, optical technology offers numerous advantages over traditional electronic communication methods. For instance, optical signals allow for extremely high transmission rates and very high bandwidth capacity. Additionally, optics also provide more secure signaling since it does not allow partial signals to escape from the optical fiber cables, a situation that can occur in wired systems. Optical transmission can also cover longer distances without signal losses typically associated with copper wires carrying telecommunication signals.

With the increasing speeds of optical transmission offered by electronic modules, additional issues have arisen. For example, electronic devices and components operating at high frequencies often emit signals known as electromagnetic interference (EMI). This form of electrical noise is undesirable as EMI can disrupt the normal operation of other electronic components. Optical transceiver packaging, especially those operating at high transmission speeds, are particularly susceptible to the influence of EMI radiation.

SUMMARY

According to one or more embodiment of this disclosure, an optical transceiver includes a substrate, a plurality of filtering capacitors, a plurality of radio-frequency signal lines and a plurality of ground vias. The substrate has two side edges opposite to each other and a distal edge between the two side edges and has a main region and a golden finger region closer to the distal edge than the main region. The plurality of filtering capacitors are disposed in the main region on the substrate. The plurality of radio-frequency signal lines are connected to the plurality of filtering capacitors and each includes: a first conductive portion, a second conductive portion and a conductive via. The first conductive portion is disposed in the substrate and extends from the main region to the golden finger region. The second conductive portion is disposed on the substrate and locates in the golden finger region. The conductive via conductively connects the first conductive portion and the second conductive portion and extends no more than three layers of the substrate. The plurality of ground vias are located at the two side edges and the distal edge and extend from the main region to the golden finger region. A shortest distance between each one of the plurality of radio-frequency signal lines and the two side edges is larger than 0.95 mm.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present disclosure. The following embodiments further illustrate various aspects of the present disclosure, but are not meant to limit the scope of the present disclosure.

Figure 1:
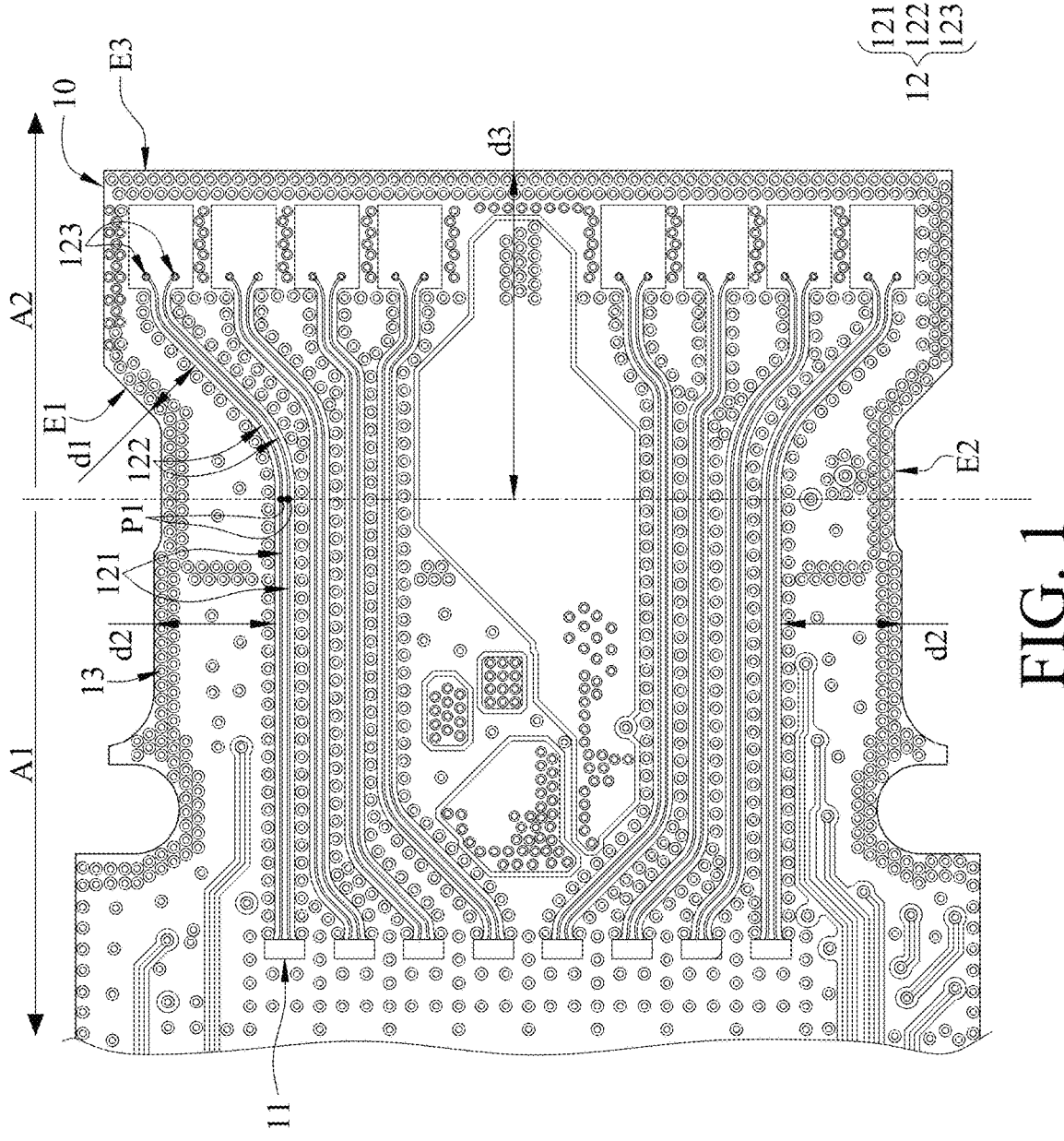
FIG. 1 is a schematic diagram illustrating an optical transceiver according to an embodiment of the present disclosure.

Please refer to FIG. 1, wherein FIG. 1 is a schematic diagram illustrating an optical transceiver according to an embodiment of the present disclosure. FIG. 1 shows the implementation of the optical transceiver 1 with an octal small form factor pluggable (OSFP) transceiver. As shown in FIG. 1, the optical transceiver 1 includes a substrate 10, a plurality of filtering capacitors 11, a plurality of radio-frequency (RF) signal lines 12 and a plurality of ground vias 13.

The substrate 10 has two side edges E1 and E2 and a distal edge E3. The two side edges E1 and E2 are opposite to each other. The two side edges E1 and E2 connect to each other and are defined to have the same or different distances from a closest RF signal line 12. The distal edge E3 is between the side edges E1 and E2. Further, the substrate 10 has a main region A1 and a golden finger region A2. The golden finger region A2 is closer to the distal edge E3 than the main region A1.

The filtering capacitors 11 are disposed in the main region A1 on the substrate 10 and connected to the RF signal lines 12. The filtering capacitors 11 may also correspond to the RF signal lines 12 in an one-on-one relationship. A shortest distance d1 between the RF signal lines 12 and the side edges E1 and E2 is larger than 0.95 mm. Further, a shortest distance d2 between one of the radio-frequency signal lines 12 and each of the two side edges E1 and E2 is larger than 1.3 mm. In one implementation, the shortest distance d2 between a part of each one of the RF signal lines 12 and each one of the side edges E1 and E2 may be larger than 1.3 mm, wherein said part of each one of the RF signal lines 12 and the distal edge E3 may have a distance d3 of 8 mm therebetween.

Each of the RF signal lines 12 includes a first conductive portion 121, a second conductive portion 122 and a conductive via 123. The first conductive portion 121 extends from the main region A1 to the golden finger region A2. The second conductive portion 122 is located in the golden finger region A2. Said part of each one of the RF signal lines 12 may be a point P1 of each of the first conductive portion 121 connecting a corresponding second conductive portion 122.

Figure 2:
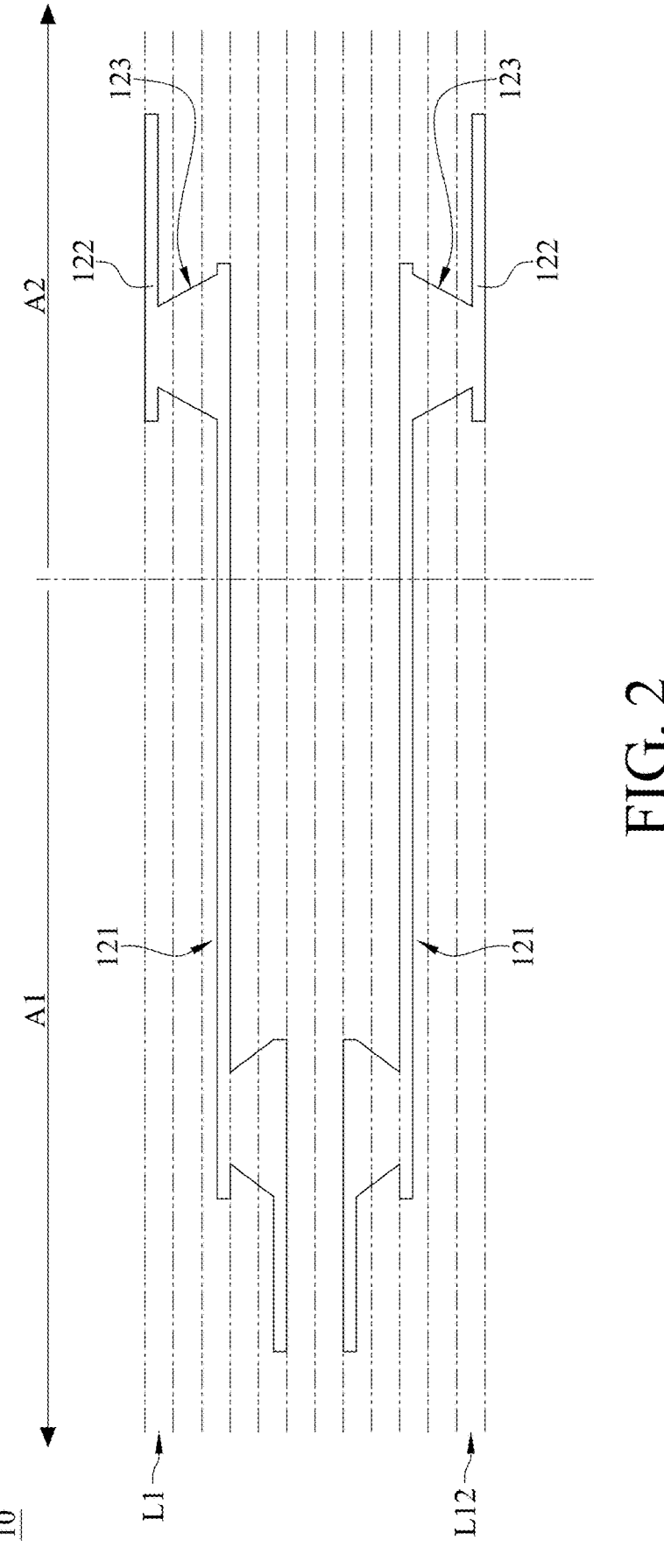
FIG. 2 is a schematic diagram illustrating the configuration of a radio-frequency signal line at a substrate according to an embodiment of the present disclosure.

Please refer to FIG. 1 and FIG. 2, wherein FIG. 2 is a schematic diagram illustrating the configuration of a radio-frequency signal line at a substrate according to an embodiment of the present disclosure. The substrate 10 is formed of multiple layers, and FIG. 2 shows the substrate 10 with 12 layers. As shown in FIG. 2, the first conductive portion 121 is within the substrate and at least a part of the second conductive portion 122 is on an outer surface of the substrate 10. The conductive via 123 conductively connects the first conductive portion 121 and the second conductive portion 122. FIG. 2 exemplarily shows that the conductive via 123 extends from the top layer L1 to the middle layer L3. In other words, the conductive via 123 extends no more than three layers of the substrate 10, thereby reducing electromagnetic interference (EMI) radiation. FIG. 2 exemplarily shows two RF signal lines 12 where one is disposed at the upper half of the substrate 10, and the other one is disposed at the lower half of the substrate 10. In other embodiment, the RF signal lines 12 may only be disposed at the upper half or the lower half of the substrate 10. It should be noted that the number of layers of the substrate 10 shown in FIG. 2 is merely an example.

Figure 3:
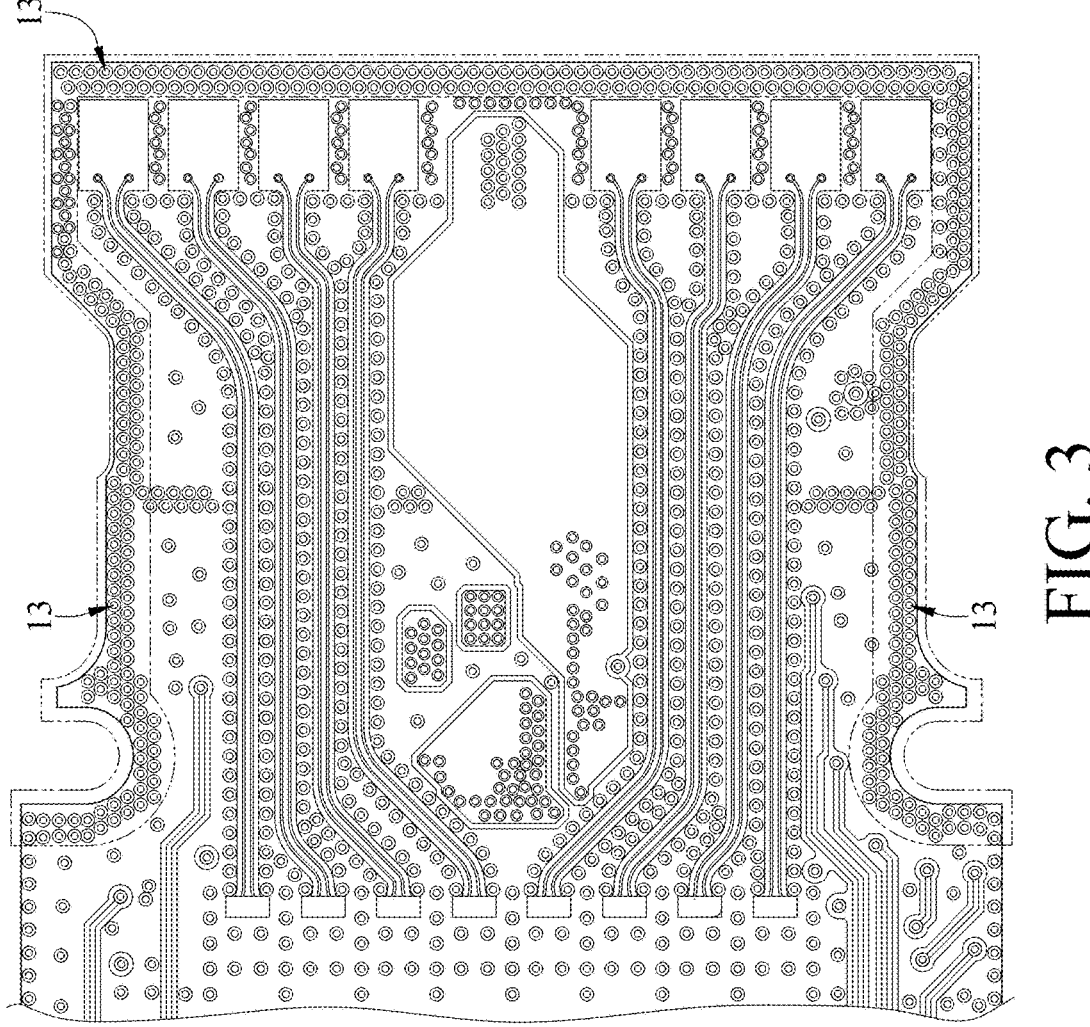
FIG. 3 is a schematic diagram illustrating location of ground vias of the optical transceiver shown in FIG. 1.
Figure 4:
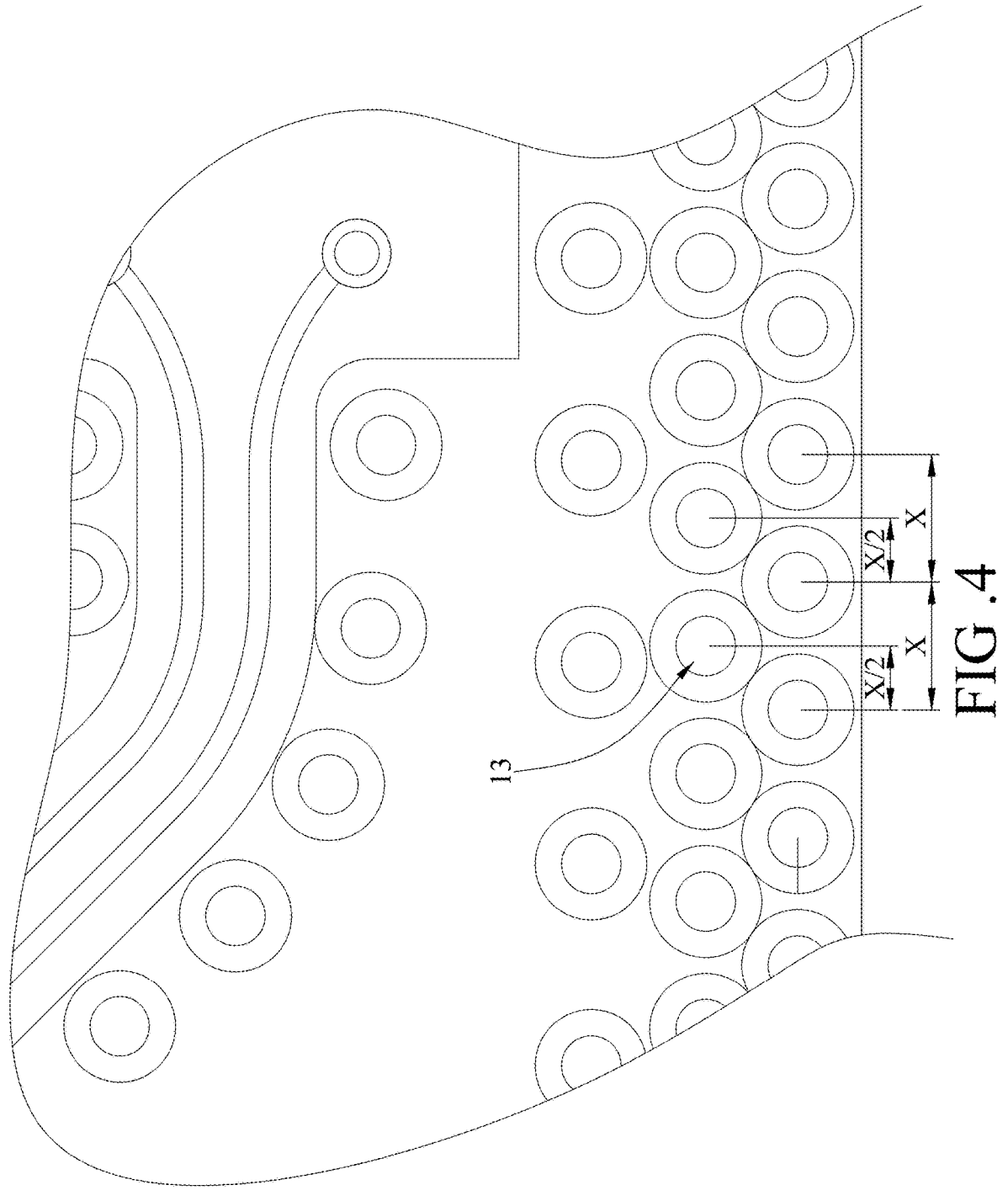
FIG. 4 is a schematic diagram illustrating the arrangement of the ground vias according to an embodiment of the present disclosure.
Figure 5:
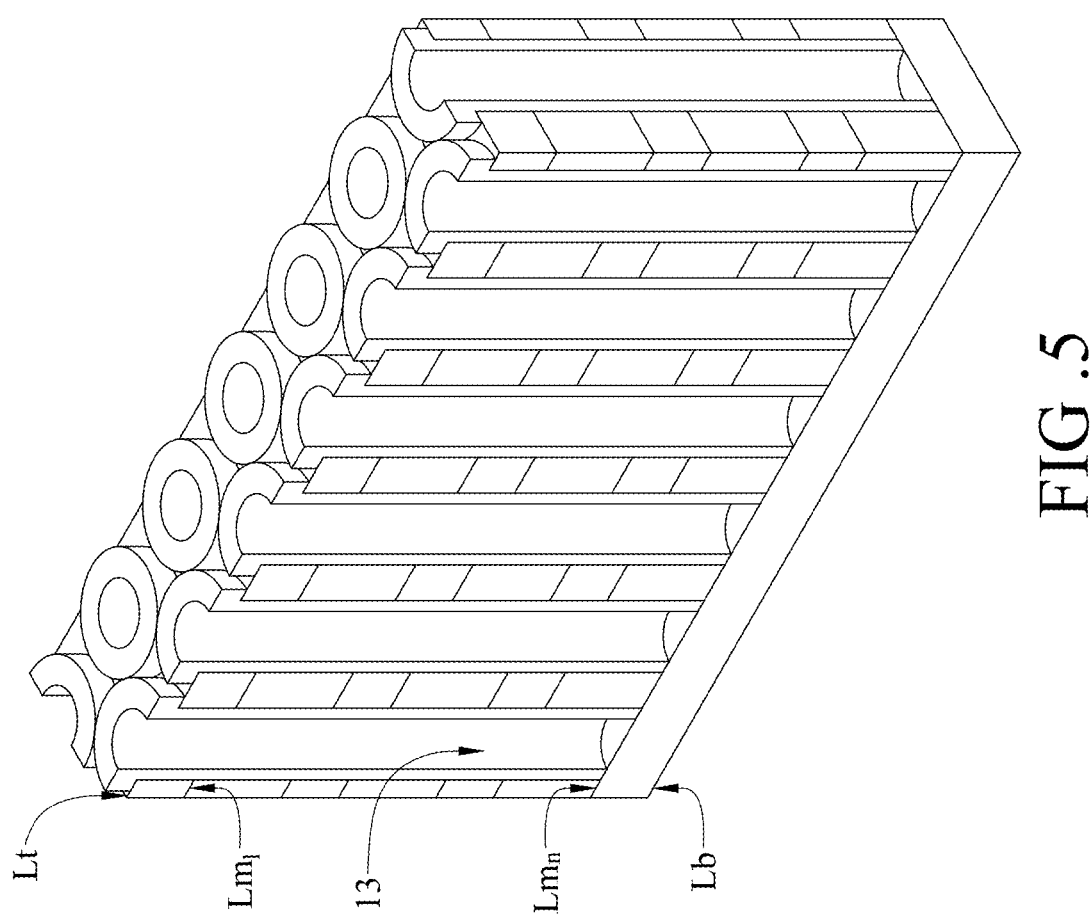
FIG. 5 is a schematic diagram illustrating the ground vias penetrating the substrate according to an embodiment of the present disclosure.

In conjunction with FIG. 1 FIG. 3 is a schematic diagram illustrating location of ground vias of the optical transceiver shown in FIG. 1, FIG. 4 is a schematic diagram illustrating the arrangement of the ground vias according to an embodiment of the present disclosure, and FIG. 5 is a schematic diagram illustrating the ground vias penetrating the substrate according to an embodiment of the present disclosure. The ground vias 13 are located at the two side edges E1 and E2 and the distal edge E3. A part of the ground vias 13 may be located in the main region A1, and the other part of the ground vias 13 may be located in the golden finger region A2. In other words, the ground vias 13 might be distributed starting from the main region A1 to the golden finger region A2. With the ground vias 13 at the two side edges E1 and E2 and the distal edge E3, EMI leakage through the sides of the substrate 10 may be reduced.

As shown in FIG. 4, projections of the ground vias 13 on the substrate 10 are staggered with each other. In other words, the ground vias 13 may define a fence structure. In said fence structure, a distance x/2 is between a center of one ground via 13 located on one line and a center of a ground via 13 located on an adjacent line. And distance X might be present between the two ground vias disposed in the same line (should we give each line a number?)

As shown in FIG. 5, the substrate 10 may have the top layer Lt, the middle layers $Lm_1$ to $Lm_n$ and the bottom layer Lb, wherein n is a positive integer greater than 3. Each of the ground vias 13 may penetrate the substrate 10 through the top layer Lt to $Lm_n$. It should be noted that the number of layers of the substrate 10 shown in FIG. 5 is merely an example.

Figure 6:
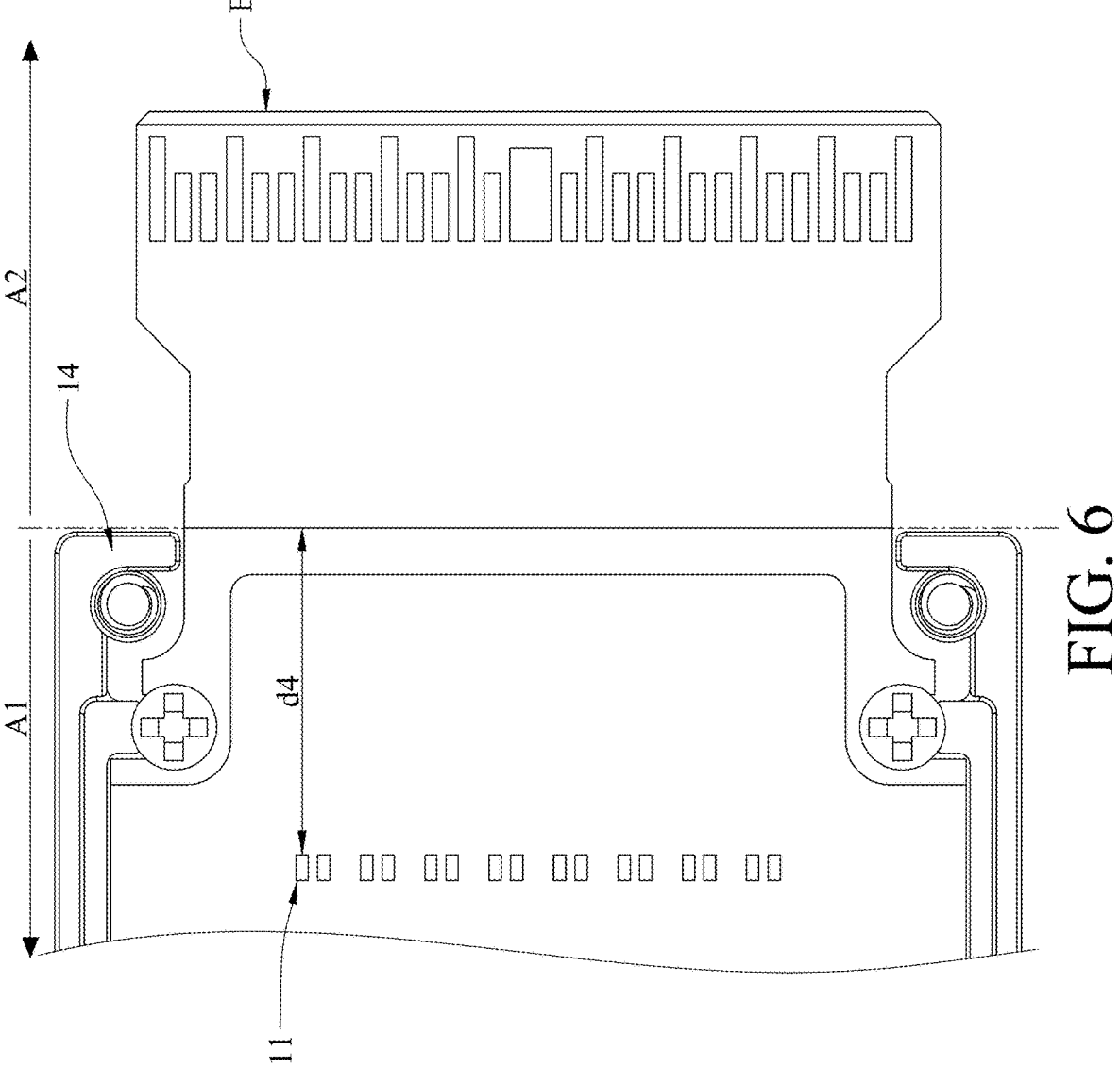
FIG. 6 is a schematic diagram illustrating an optical transceiver with a shell according to an embodiment of the present disclosure.

In conjunction with FIG. 1, FIG. 6 is a schematic diagram illustrating an optical transceiver with a shell according to an embodiment of the present disclosure. The optical transceiver 1 further includes a shell 14. The shell 14 might be used to define a virtual boundary separating the main region A1 from the golden finger region A2. The filtering capacitors 11 might be located within the main region A1, with both the main region A1 and the golden finger region A2 having their own RF signal lines 12 and ground vias 13. In addition, a distance d4 between each of the filtering capacitors 11 and an edge of the shell 14 that is closest to the distal edge E3 is larger than 2.3 mm. Accordingly, EMI leakage through the gap of the shell may be effectively suppressed.

Figure 7:
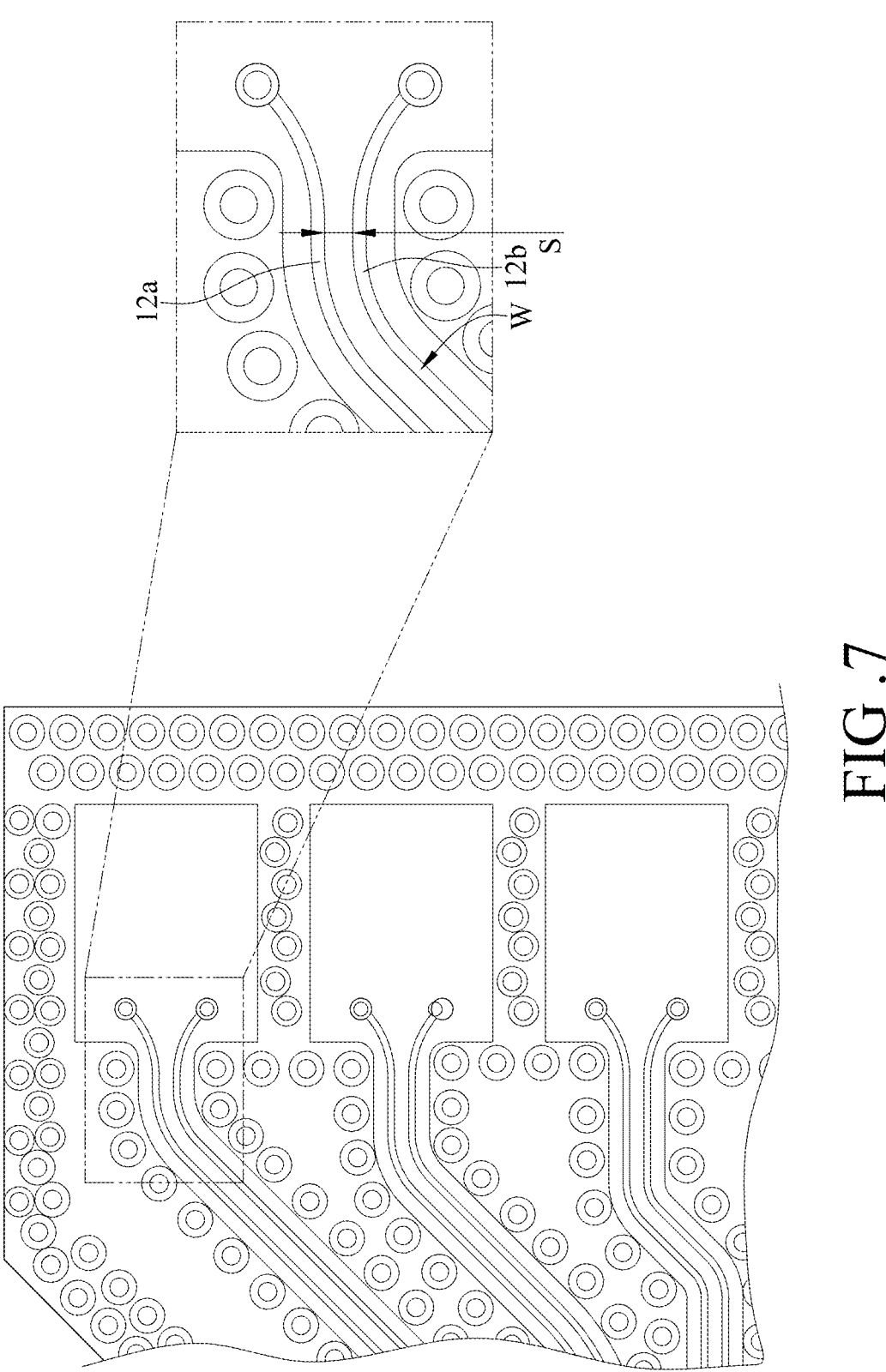
FIG. 7 is an enlarged diagram illustrating a pair of differential signal lines of the radio-frequency signal line according to an embodiment of the present disclosure.

Please refer to FIG. 1 and FIG. 7, wherein FIG. 7 is an enlarged diagram illustrating a pair of differential signal lines of the radio-frequency signal line according to an embodiment of the present disclosure. Each of the RF signal lines may include a pair of differential signal lines 12a and 12b. A distance S between the pair of differential signal lines 12a and 12b is less than three times of a width W of each one of the pair of differential signal lines 12a and 12b. The distance S of the differential signal lines 12a and 12b in the main region and the distance S of the differential signal lines 12a and 12b the golden finger region might be the same in one implementation. The widths of the differential signal lines 12a and 12b might remain the same throughout the main region and the golden finger region. With the above arrangement, EMI level may be effectively reduced.

Please refer to table 1 below, which shows the testing result of EMI leakage on the optical transceiver not having the structure described with reference to FIGS. 1 to 7 (condition 1) and the optical transceiver having the structure described with reference to FIGS. 1 to 7 (condition 2).

TABLE 1

| Condition | Type | Freq. (GHz) | Level (dBuV/m) | Limit (dBuV/m) | Margin (dB) | Distance (m) |
|---|---|---|---|---|---|---|
| Condition 1 | Peak | 26.5625 | 71.05 | 89.54 | −18.49 | 1 |
| | Average | 26.5625 | 68.42 | 69.54 | −1.12 | 1 |
| Condition 2 | Peak | 26.5625 | 61.12 | 89.54 | −28.42 | 1 |
| | Average | 26.5625 | 59.84 | 69.54 | −9.7 | 1 |
| EMI improvement | | ΔAverage | | | 8.58 | — |

In table 1, the testing parameters of carrier frequency, field strength level, field strength limit and test distance are shown. The margin of the average type of condition 2 is higher than that of condition 1 by 8.58, which shows that condition 2 has improvement in reducing EMI.

Figure 8:
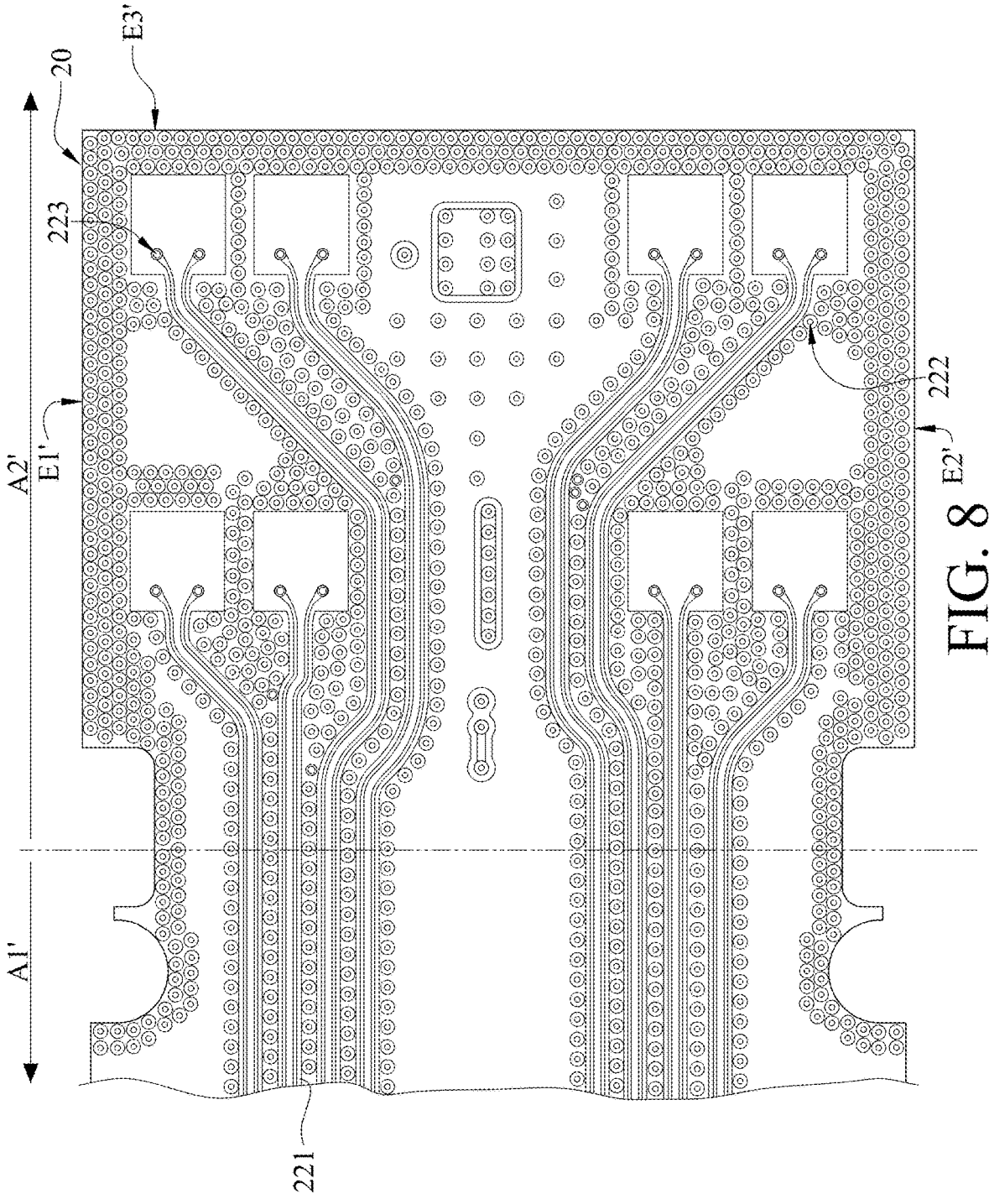
FIG. 8 is a schematic diagram illustrating an optical transceiver according to another embodiment of the present disclosure.

Please refer to FIG. 8, wherein FIG. 8 is a schematic diagram illustrating an optical transceiver according to another embodiment of the present disclosure. FIG. 8 shows the implementation of the optical transceiver 2 with a quad small form factor pluggable double density (QSFP-DD) transceiver. As shown in FIG. 8, the optical transceiver 2 includes a substrate 20, a plurality of filtering capacitors 21, a plurality of RF signal lines 22 and a plurality of ground vias 23.

The substrate 20 has two side edges E1' and E2' and a distal edge E3'. The two side edges E1' and E2' are opposite to each other. The distal edge E3' is between the side edges E1' and E2'. Further, the substrate 20 has a main region A1' and a golden finger region A2'. The golden finger region A2' is closer to the distal edge E3' than the main region A1'.

Figure 9:
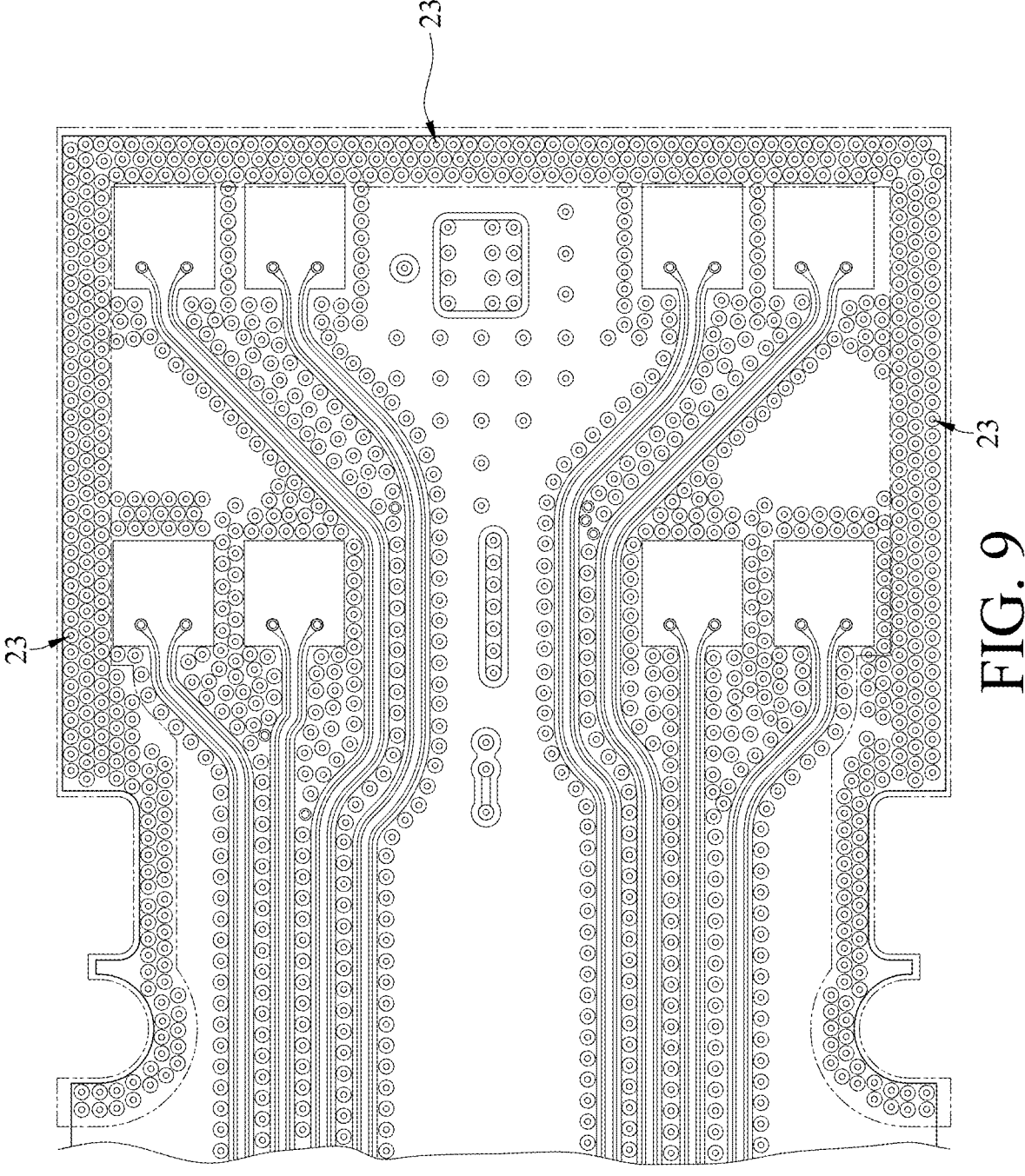
FIG. 9 is a schematic diagram illustrating location of ground vias of the optical transceiver shown in FIG. 8.

Each of the RF signal lines 22 includes a first conductive portion 221, a second conductive portion 222 and a conductive via 223. The first conductive portion 221 is disposed in the substrate 20 and extending from the main region A1' to the boundary virtually separating the golden finger region A2' from the main region A1'. The second conductive portion 222 is disposed on the substrate 20 and located in the golden finger region A2'. The conductive via 223 conductively connects the first conductive portion 221 and the second conductive portion 222. As with the implementation in FIG. 5, the conductive vias 223 might only reach to the third layer of the substrate starting from the surface of the same In conjunction with FIG. 8, FIG. 9 is a schematic diagram illustrating location of ground vias of the optical transceiver shown in FIG. 8. The ground vias 23 are located at the two side edges E1' and E2' and the distal edge E3'. A part of the ground vias 23 may be located in the main region A1', and the other part of the ground vias 23 may be located in the golden finger region A2'. The ground vias 23 extend from the main region A1' to the golden finger region A2'.

The structure of the optical transceiver described with reference to FIGS. 1 to 7 may be applied to the optical transceiver 2 shown in FIG. 8 and FIG. 9, their detail descriptions are not repeated herein.

Figure 10:
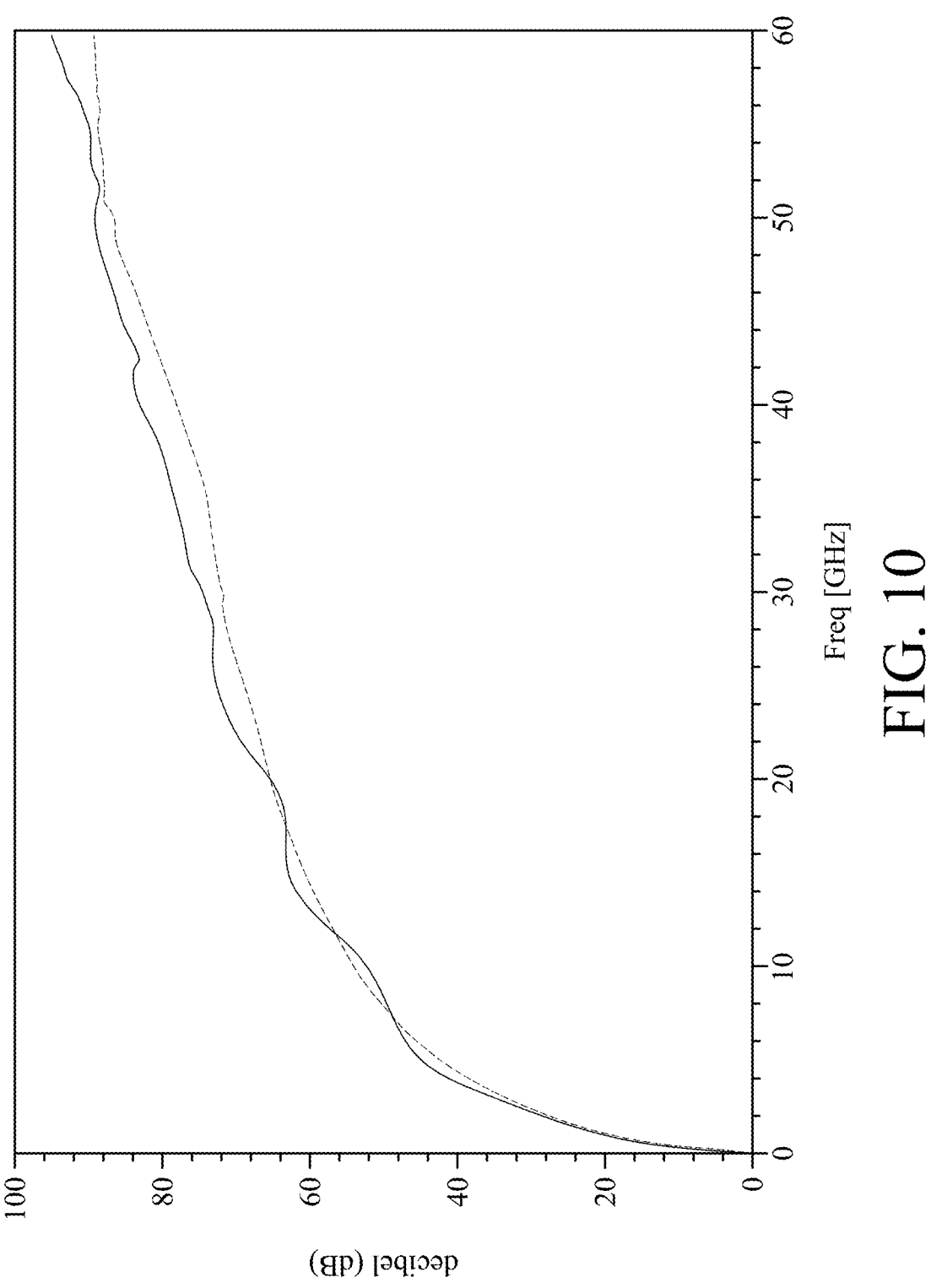
FIG. 10 shows experiment results of electromagnetic interference (EMI) level with conductive via extending different layers of the substrate.

Please refer to FIG. 10, wherein FIG. 10 shows experiment results of EMI level with conductive via extending different layers of the substrate. The unit of the horizontal axis of the graph in FIG. 10 is frequency (GHz), and the unit of the vertical axis of the graph in FIG. 10 is decibel (dB). The graph of FIG. 10 is the result of the optical transceiver with a conductive via extending three layers of the substrate (represented by the dotted line) and the result of the optical transceiver with a conductive via extending more than six layers of the substrate (represented by the solid line). As shown in FIG. 10, for the conductive via extending three layers, the suppressed EMI level at a frequency range of 0-26 GHz is 72.8734 dB, and the suppressed EMI level at a frequency range of 0-50 GHz is 94.9045 dB; and for the conductive via extending six layers, the suppressed EMI level at a frequency range of 0-26 GHz is 69.4689 dB, and the suppressed EMI level at a frequency range of 0-50 GHz is 89.1825 dB.

Figure 11:
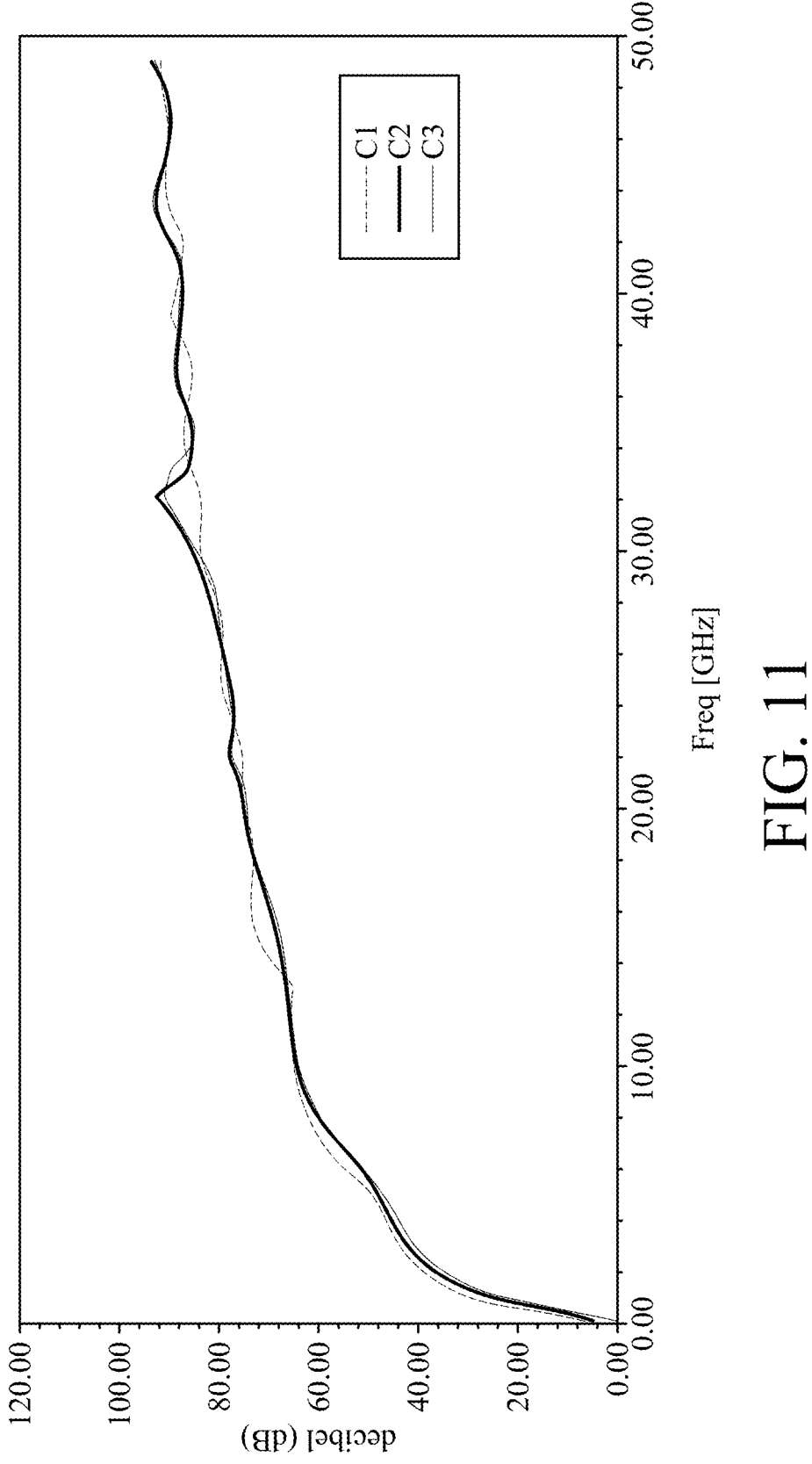
FIG. 11 shows experiment results of EMI level on different distances between a pair of differential signal lines.

Please refer to FIG. 11, wherein FIG. 11 shows experiment results of EMI level on different distances between a pair of differential signal lines. The unit of the horizontal axis of the graph in FIG. 11 is frequency (GHz), and the unit of the vertical axis of the graph in FIG. 11 is decibel (dB). The first curve C1 is the result of a distance between a pair of differential signal lines greater than three times of a width of each one of the pair of differential signal lines. The second curve C2 is the result of a distance between a pair of differential signal lines being 72.5 mil, and a width of each one of the pair of differential signal lines being 26.5 mil. At the same time, the third curve C3 is the result of a distance between a pair of differential signal lines being 74 mil, and a width of each one of the pair of differential signal lines being 25 mil.

An absolute value of the EMI of the first curve C1 is 79.6618 dB, an absolute value of the EMI of the first curve C2 is 77.5921 dB, and an absolute value of the EMI of the third curve C3 is 77.8267 dB. The EMI of the second curve C2 is 2.1 dB lower than that of the first curve C1, the EMI of the third curve C3 is 1.8 dB lower than that of the first curve C1, and the EMI of the second curve C2 is lower than that of the third curve C3. Accordingly, it can be seen that when the distance between a pair of differential signal lines becomes shorter (i.e., widths of a pair of differential signal lines becomes larger), EMI level could be effectively reduced.

In view of the above description, EMI on the optical transceiver according to one or more embodiments of the present disclosure may be reduced, thereby lowering the impact of electromagnetic interference on the operation of the optical transceiver.

The embodiments are chosen and described in order to best explain the principles of the present disclosure and its practical applications, to thereby enable others skilled in the art to best utilize the present disclosure and various embodiments with various modifications as are suited to the particular use being contemplated. It is intended that the scope of the present disclosure is defined by the following claims and their equivalents.

What is claimed is:

1. An optical transceiver, comprising:
a substrate having two side edges opposite to each other and a distal edge between the two side edges and having a main region and a golden finger region closer to the distal edge than the main region;
a plurality of filtering capacitors disposed in the main region on the substrate; and
a plurality of radio-frequency signal lines connected to the plurality of filtering capacitors and each comprising:
a first conductive portion disposed in the substrate and extending from the main region to the golden finger region;
a second conductive portion disposed on the substrate and located in the golden finger region; and
a conductive via conductively connecting the first conductive portion and the second conductive portion and extending no more than three layers of the substrate; and
a plurality of ground vias located at the two side edges and the distal edge, and the plurality of ground vias are distributed from the main region along the two side edges to the distal edge,
wherein projections of the plurality of ground vias on the substrate are staggered with each other to define a fence structure;
wherein a shortest distance between each one of the plurality of radio-frequency signal lines and the two side edges is larger than 0.95 mm.

2. The optical transceiver according to claim 1, wherein a shortest distance between a part of each one of the plurality of radio-frequency signal lines and each one of the two side edges is larger than 1.3 mm, wherein the part of each one of the plurality of radio-frequency signal lines and the distal edge have a distance of 8 mm therebetween.

3. The optical transceiver according to claim 1, wherein a shortest distance between each one of the plurality of radio-frequency signal lines and each of the two side edges is larger than 1.3 mm.

4. The optical transceiver according to claim 1, further comprising a shell, wherein the main region and the golden finger region is divided by the shell.

5. The optical transceiver according to claim 4, wherein a distance between each of the plurality of filtering capacitors and an edge of the shell that is closest to the distal edge is larger than 2.3 mm.

6. The optical transceiver according to claim 1, wherein the plurality of ground vias each penetrates the substrate.

7. The optical transceiver according to claim 1, wherein a part of the plurality of ground vias are located in the main region.

8. The optical transceiver according to claim 1, wherein each one of the plurality of radio-frequency signal lines further comprises a pair of differential signal lines, a distance between the pair of differential signal lines is less than three times of a width of each one of the pair of differential signal lines.

9. An optical transceiver, comprising:
a substrate having two side edges opposite to each other and a distal edge between the two side edges and having a main region and a golden finger region closer to the distal edge than the main region;
a plurality of filtering capacitors disposed in the main region on the substrate; and
a plurality of radio-frequency signal lines connected to the plurality of filtering capacitors and each comprising:
a first conductive portion disposed in the substrate and extending from the main region to the golden finger region;
a second conductive portion disposed on the substrate and located in the golden finger region; and
a conductive via conductively connecting the first conductive portion and the second conductive portion and extending no more than three layers of the substrate; and
a plurality of ground vias located at the two side edges and the distal edge and distributed from the main region to the golden finger region,
wherein a shortest distance between each one of the plurality of radio-frequency signal lines and the two side edges is larger than 0.95 mm, wherein each one of the plurality of radio-frequency signal lines further comprises a pair of differential signal lines, a distance between the pair of differential signal lines is less than three times of a width of each one of the pair of differential signal lines.

10. The optical transceiver according to claim 9, wherein a shortest distance between a part of each one of the plurality of radio-frequency signal lines and each one of the two side edges is larger than 1.3 mm, wherein the part of each one of the plurality of radio-frequency signal lines and the distal edge have a distance of 8 mm therebetween.

11. The optical transceiver according to claim 9, wherein a shortest distance between each one of the plurality of radio-frequency signal lines and each of the two side edges is larger than 1.3 mm.

12. The optical transceiver according to claim 9, further comprising a shell, wherein the main region and the golden finger region is divided by the shell.

13. The optical transceiver according to claim 12, wherein a distance between each of the plurality of filtering capacitors and an edge of the shell that is closest to the distal edge is larger than 2.3 mm.

14. The optical transceiver according to claim 9, wherein the plurality of ground vias each penetrates the substrate.

15. The optical transceiver according to claim 9, wherein projections of the plurality of ground vias on the substrate are staggered with each other to define a fence structure.

16. The optical transceiver according to claim 9, wherein a part of the plurality of ground vias are located in the main region.

* * * * *